(12) United States Patent
Pothireddy et al.

(10) Patent No.: US 7,667,629 B2
(45) Date of Patent: Feb. 23, 2010

(54) GENERATING A GRAY CODE FOR AN ODD LENGTH SEQUENCE USING A VIRTUAL SPACE

(75) Inventors: Anil Pothireddy, Hyderabad (IN); Jayashri Arsikere Basappa, Karnataka (IN); David Grant Wheeler, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/127,179

(22) Filed: May 27, 2008

(65) Prior Publication Data
US 2009/0295608 A1 Dec. 3, 2009

(51) Int. Cl.
*H03M 7/04* (2006.01)
(52) U.S. Cl. .......................................... 341/98; 341/70
(58) Field of Classification Search .............. 341/70–99
See application file for complete search history.

(56) References Cited

U.S. PATENT DOCUMENTS

| 4,618,849 | A | * | 10/1986 | Bruestle | 341/98 |
|---|---|---|---|---|---|
| 5,097,491 | A | * | 3/1992 | Hall | 377/34 |
| 5,164,968 | A | * | 11/1992 | Otto | 377/34 |
| 5,426,756 | A | * | 6/1995 | Shyi et al. | 711/159 |
| 5,448,606 | A | * | 9/1995 | Snelgrove | 377/34 |
| 5,754,614 | A | * | 5/1998 | Wingen | 377/34 |
| 6,703,950 | B2 | * | 3/2004 | Yi | 341/97 |
| 6,836,525 | B1 | | 12/2004 | Weng | |

* cited by examiner

*Primary Examiner*—Lam T Mai
(74) *Attorney, Agent, or Firm*—Stanley Ferrence; Grant A. Johnson

(57) ABSTRACT

Methods for generating Gray count for an odd length sequence using a virtual space. More than one set of Gray codes can be generated for a given odd multiple virtual domains that assists in achieving more robust systems which are fault tolerant. Broadly contemplated herein is the use of a simple and elegant algorithm which is less complex and uses only an N-bit sequence.

16 Claims, 3 Drawing Sheets

GENERATING A GRAY CODE FOR AN ODD LENGTH SEQUENCE USING A VIRTUAL SPACE

FIELD OF THE INVENTION

The present invention relates generally to Gray codes and Gray code sequences as employed in computer systems.

BACKGROUND OF THE INVENTION

Gray code sequences, as commonly known and employed in the computer arts, have the advantage of involving solely a 1-bit difference between any two consecutive numbers in a sequence. (General background information on Gray codes can be found in a very wide variety of sources, including http://en.wikipedia.org/wiki/Gray code.) This stands in stark contrast to a standard binary sequence, where more than one bit may differ between consecutive numbers. As a result, binary sequences can cause problems in circuits that are noise sensitive or that involve multiple clock domain frequencies. Because Gray codes only involve a 1-bit difference at a time in a sequence count, performance can be greatly improved in the scenarios just mentioned.

However, Gray codes conventionally have borne the requirement that the length of a sequence needs to be a power of 2 if the sequence is to be employed cyclically. This is essentially intuitive, but can be illustrated by a simple example of a count of six (as also can be appreciated from Table 1 herebelow): 0000, 0001, 0011, 0010, 0110, 0111. In other words, for a sequence length that is not a power of 2, a Gray code cannot be used cyclically without actually compromising the aforementioned distinguishing characteristic of Gray codes, wherein only a 1-bit difference is encountered at a time. Thus, needs have long been recognized in connection with providing arrangements for generating cyclic Gray code that is able to count lengths that are not a power of 2.

In response to such needs, methods have been developed for generating Gray codes for sequences that have lengths that are not a power of two, but these have been severely restricted to solely those sequences with lengths that are of an even-numbered value (or, a multiple of two). Accordingly, conventional methods have failed to address those sequences with lengths of an odd-numbered value.

To illustrate this problem in more detail, there certainly exist applications, such as asynchronous FIFO (first-in-first-out) address generation or the transfer of cyclic data across asynchronous clock domains, that demand the use of a Gray code for odd lengths. More particularly, for asynchronous FIFOs, the address field is usually Gray-coded. Thus, as an example, there may be a need to hold a 128-bit data of 11 entries. Many conventional Gray code methods only permit FIFO depths to be a power-of-2, so in those cases the closest permitted value to 11 would be 16. Other known methods permit the usage of an even number of entries, so the closest attainable value in that case would be 12.

Accordingly, in view of the foregoing, a highly compelling need has been recognized in connection with providing methods and arrangements for counting (or generating addresses over) an odd numbered sequence in Gray code.

SUMMARY OF THE INVENTION

In accordance with at least one presently preferred embodiment of the present invention, there is broadly contemplated herein a method for generating cyclic Gray codes for all odd lengths that can be expressed as $(2*K+1)$, where K is a positive integer. This can preferably be accomplished by using a virtual space in which a sequence length is doubled, and thereby rendered even, for the sole purpose of enabling the use of a Gray code and thereby taking advantage of the maximum 1-bit difference between consecutive numbers normally afforded by a Gray code.

In summary, one aspect of the invention provides an apparatus comprising: a system comprising: a main memory; a system processor; and a Gray code applicator comprising: an input which accepts a binary number sequence; a modifier which modifies an input binary number sequence of odd-numbered length; the modifier acting to retain, in a binary number sequence of odd-numbered length, a transition between each pair of successive numbers that is no greater than a one-bit transition.

Another aspect of the invention provides a method comprising: accepting a binary number sequence of odd-numbered length; applying Gray code to the accepted binary number sequence via: modifying the accepted binary number sequence; and retaining, in the modified binary number sequence, a transition between each pair of successive numbers that is no greater than a one-bit transition.

Furthermore, an additional aspect of the invention provides a program storage device readable by machine, tangibly embodying a program of instructions executable by the machine to perform a method comprising: accepting a binary number sequence of odd-numbered length; applying Gray code to the accepted binary number sequence via: modifying the accepted binary number sequence; and retaining, in the modified binary number sequence, a transition between each pair of successive numbers that is no greater than a one-bit transition.

For a better understanding of the present invention, together with other and further features and advantages thereof, reference is made to the following description, taken in conjunction with the accompanying drawings, and the scope of the invention will be pointed out in the appended claims.

DETAILED DESCRIPTION OF THE PREFERRED EMBODIMENTS

For a better understanding of the present invention, together with other and further features and advantages thereof, reference is made to the following description, taken in conjunction with the accompanying drawings, and the scope of the invention will be pointed out in the appended claims.

Figure 1:
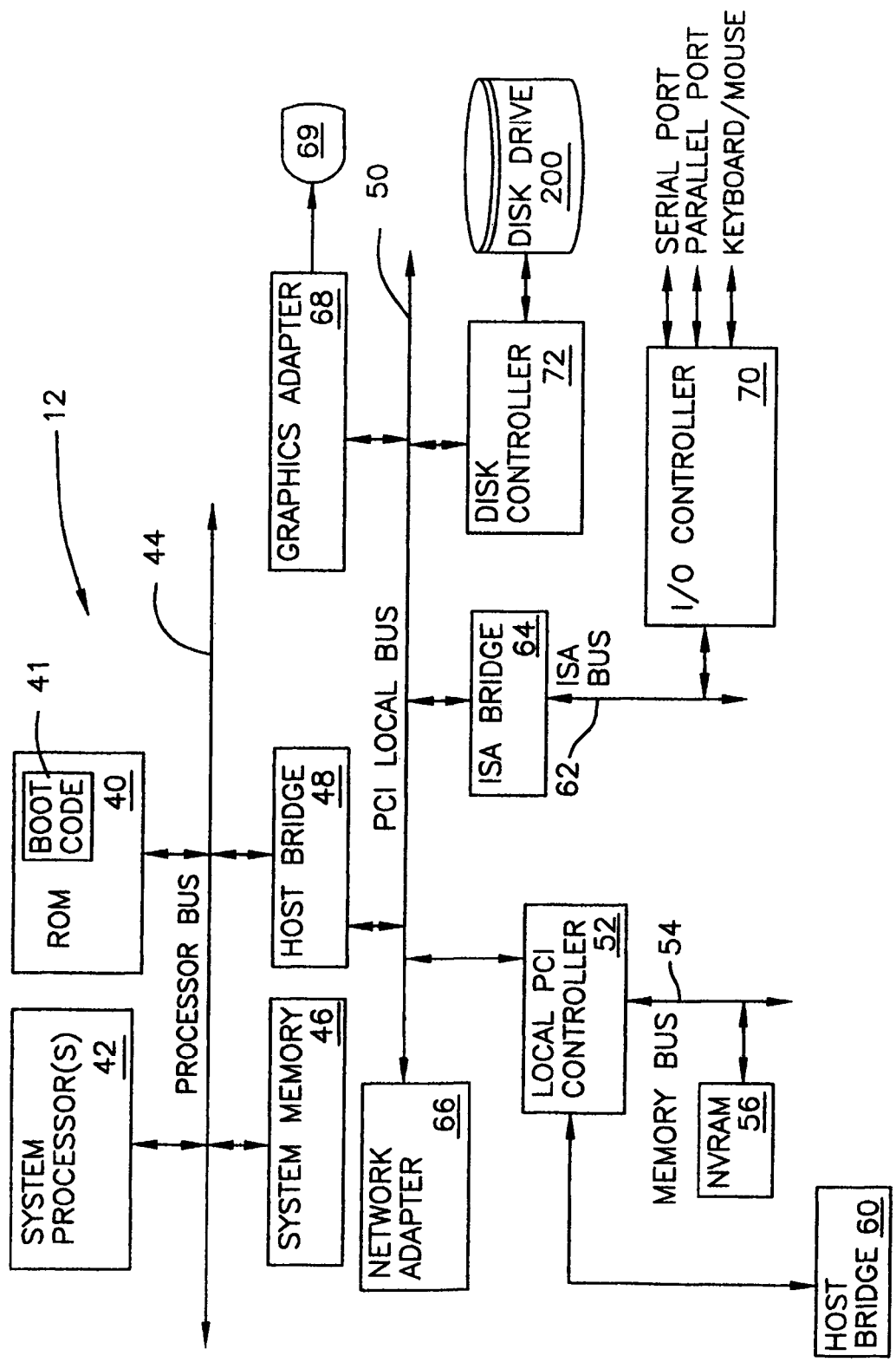
FIG. 1 schematically illustrates a computer system.
Figure 2:
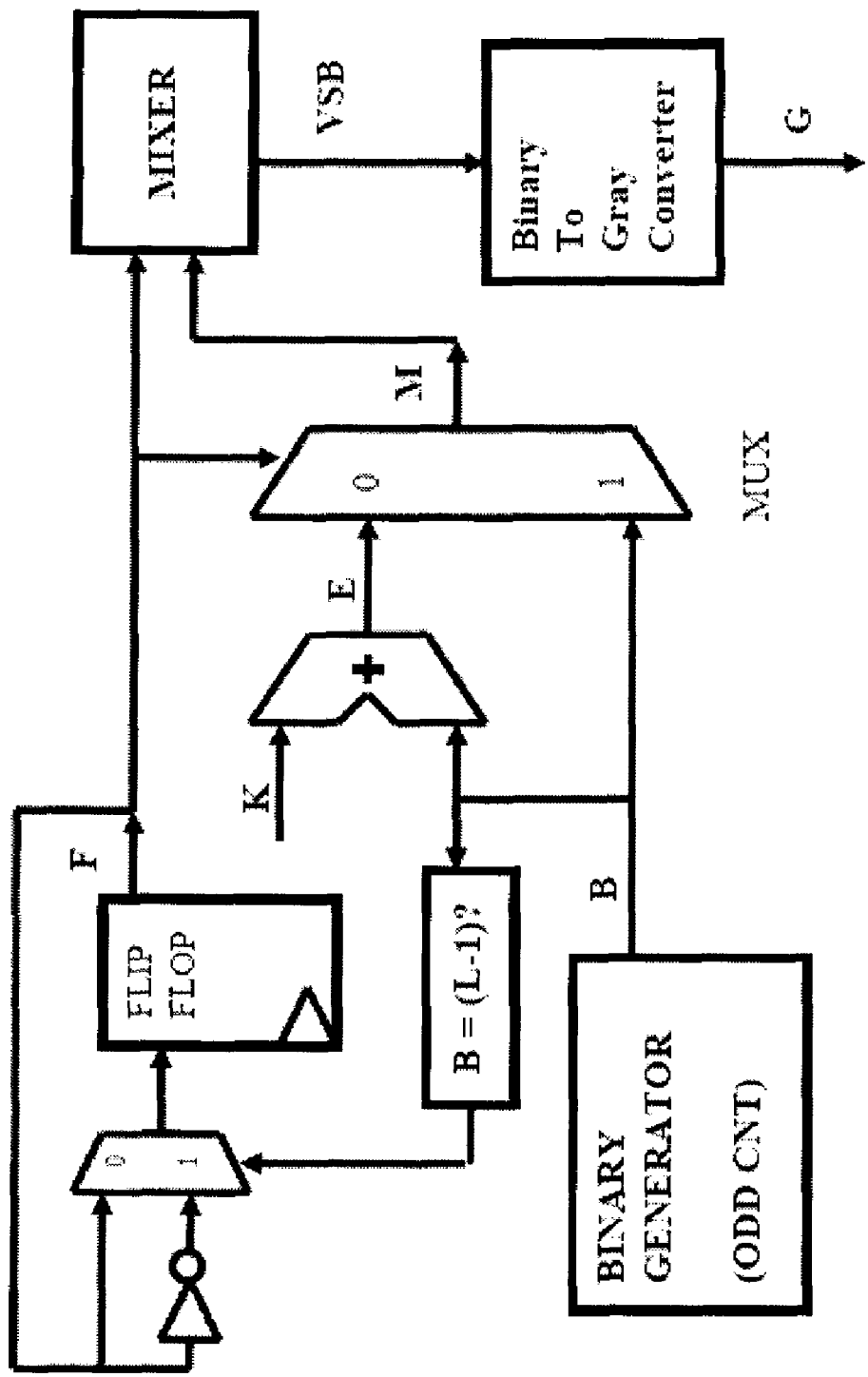
FIG. 2 schematically illustrates a digital logic circuit for generating a virtual space binary.
Figure 3:
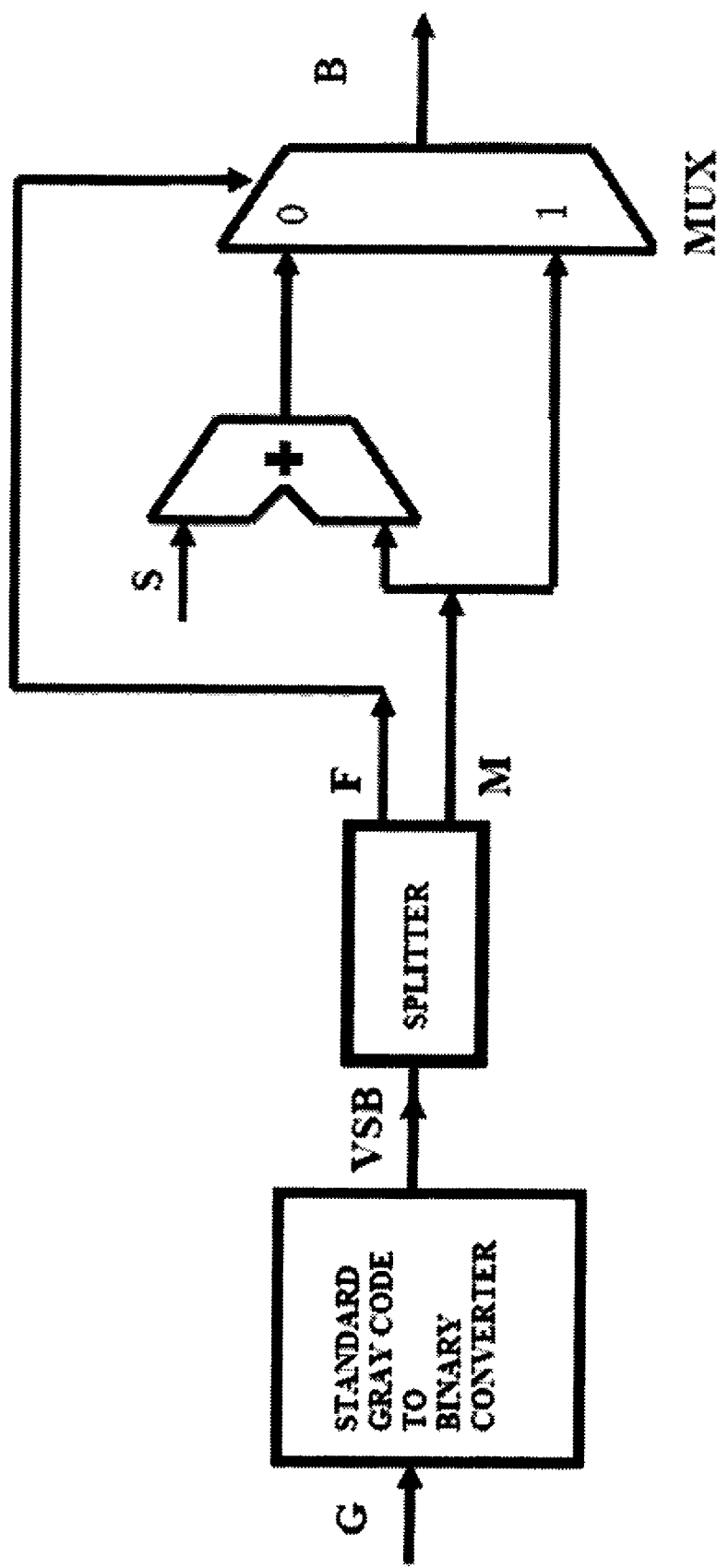
FIG. 3 schematically illustrates a digital logic circuit for converting virtual space numbers back to binary.

It will be readily understood that the components of the present invention, as generally described and illustrated in the Figures herein, may be arranged and designed in a wide variety of different configurations. Thus, the following more detailed description of the embodiments of the apparatus, system, and method of the present invention, as represented in FIGS. 1 through 3, is not intended to limit the scope of the invention, as claimed, but is merely representative of selected embodiments of the invention.

Reference throughout this specification to "one embodiment" or "an embodiment" (or the like) means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

Furthermore, the described features, structures, or characteristics may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings, wherein like parts are designated by like numerals or other labels throughout. The following description is intended only by way of example, and simply illustrates certain selected embodiments of devices, systems, and processes that are consistent with the invention as claimed herein.

Referring now to FIG. 1, there is depicted a block diagram of an illustrative embodiment of a computer system 12. The illustrative embodiment depicted in FIG. 1 may be a notebook computer system, such as one of the ThinkPad® series of personal computers sold by Lenovo (US) Inc. of Morrisville, N.C., however, as will become apparent from the following description, the present invention is applicable to any data processing system. Notebook computers may alternatively be referred to as "notebooks", "laptops", "laptop computers" or "mobile computers" herein, and these terms should be understood as being essentially interchangeable with one another.

As shown in FIG. 1, computer system 12 includes at least one system processor 42, which is coupled to a Read-Only Memory (ROM) 40 and a system memory 46 by a processor bus 44. System processor 42, which may comprise one of the AMD™ line of processors produced by AMD Corporation or a processor produced by Intel Corporation, is a general-purpose processor that executes boot code 41 stored within ROM 40 at power-on and thereafter processes data under the control of operating system and application software stored in system memory 46. System processor 42 is coupled via processor bus 44 and host bridge 48 to Peripheral Component Interconnect (PCI) local bus 50.

PCI local bus 50 supports the attachment of a number of devices, including adapters and bridges. Among these devices is network adapter 66, which interfaces computer system 12 to a LAN, and graphics adapter 68, which interfaces computer system 12 to display 69. Communication on PCI local bus 50 is governed by local PCI controller 52, which is in turn coupled to non-volatile random access memory (NVRAM) 56 via memory bus 54. Local PCI controller 52 can be coupled to additional buses and devices via a second host bridge 60.

Computer system 12 further includes Industry Standard Architecture (ISA) bus 62, which is coupled to PCI local bus 50 by ISA bridge 64. Coupled to ISA bus 62 is an input/output (I/O) controller 70, which controls communication between computer system 12 and attached peripheral devices such as a keyboard and mouse. In addition, I/O controller 70 supports external communication by computer system 12 via serial and parallel ports. A disk controller 72 is in communication with a disk drive 200. Of course, it should be appreciated that the system 12 may be built with different chip sets and a different bus structure, as well as with any other suitable substitute components, while providing comparable or analogous functions to those discussed above.

System processor 42, of course, can be configured for executing code of great variety, including code such as that broadly contemplated herein in accordance with at least one presently preferred embodiment of the present invention.

Broadly contemplated herein, in accordance with at least one presently preferred embodiment of the present invention, is the use of a virtualization technique for permitting the counting of an odd number of entries while still being able to use the 1-bit difference characteristic of Gray code in a cyclic fashion. Each number, B, can be represented in an n-bit space such that $(2^n-1=<B<2^n)$. Preferably, the n-bit space is doubled by adding an extra bit (a flag bit) towards the MSB (most significant bit) so as to be able to uniquely represent a length that is twice the length of the odd sequence. It should be noted that as long as Gray code is used, adding an extra bit will not increase the probability of meta-stability in an asynchronous transfer.

The doubled n-bit space (n+1 bit space) can be thought as 2 n-bit domains where the MSB (n+1th bit) is a '0' in one domain (virtual domain) and a '1' in another domain (real domain). In the real domain (identified by the MSB being a '1'), the numbers are not altered, but in the virtual domain (identified by the MSB being a '0'), the numbers are encoded in such a way that the Gray codes, obtained by converting the numbers in both the domains, maintain a code distance of 1. Thus, inasmuch as cyclic Gray code cannot be generated for an odd length sequence, an extended virtual space may now be used to generate a cyclic Gray code for twice the size of the (original) odd length sequence.

By way of an illustrative and non-restrictive example, to address a FIFO of depth 11, it will be appreciated that a 4-bit address is normally needed. However, in accordance with a presently preferred technique in accordance with the present invention, the address space and the counting length are doubled. Thus, the Gray code is preferably generated for a sequence of length 22, with a 5-bit address. Though the sequence is doubled, there is a need to be able to map and retrieve two of the original sequences from the mapped sequence.

From the original 4-bit address, a 5-bit virtual address is preferably generated by adding a flag bit. The binary address generator then counts the 11-length sequence, 0 to 10, repeatedly. In the first instance of counting, the flag bit is preferably '1', meaning that the virtualization broadly contemplated herein is "OFF". When the maximum count of 11 is reached, however, the flag bit is preferably inverted (i.e., changes to '0') and the address virtualization is turned on. As such, when the virtualization is turned ON, the address will not be regarded as the same as its decimal (real) equivalent, but essentially will be an encoded address in the virtual space which can be recovered when needed.

Accordingly, the flag bit is preferably inverted every time the maximum (max) count is reached, at which point the virtualization will be switched ON and OFF. The flag bit thus distinguishes between the original (real) counting sequence and the extended (virtual) one. FIG. 2 illustrates a digital logic circuit which conveys the formation of a 5-bit virtual space address in accordance with a preferred embodiment of the present invention; as shown in FIG. 2, the 5-bit virtual space address can preferably be formed by appending the flag bit to the MSB of the original or the virtual address; the multiplexer selects either B (original address) or B+K (virtual address) based on the select/flag bit. The following symbols are used in FIG. 2:

F: Flag bit (which gets inverted after every iteration).
B: Binary count
C: Max count possible $2^n$ (where n is the number of bits in a binary number)
L: Length of the sequence
K: C−L (in this case C=16, L=11; so, K=5)
E: Output of the MUX (multiplexer), selects the original sequence B when F=1, and B+K (or B+C−L) when F=0.
M: MUX output; B when F=1, and E when F=0.
VSB: Virtual Space Binary, formed by [F,M].
G: Gray code generated by converting VSB to Gray sequence.

The digital logic circuit of FIG. 2, of course, is shown merely for illustrative and non-restrictive purposes; essentially any apparatus or arrangement may be employed which brings about the intended result discussed above.

To illustrate the advantages inherent in employing a method in accordance with at least one embodiment of the present invention, it will be noted that in a 4-bit sequence, when length is an odd number such 11, the Gray code will have more than a mere 1-bit change when rolled back. More particularly, using the example of 11, a FIFO would only have 11 entries and its address would range from 0 to 10. Only one bit in the Gray code would clearly change when counting from 0 to 10, but when there is a rollback in the sequence, i.e., when there is a transition from 10 back to 0, it will be noted that four bits actually change (namely, from 1111 to 0000). This transition can be appreciated from Table 1 below, which shows a binary and Gray sequence for a sequence length of 11.

TABLE 1

Binary and Gray sequence for a length of 11

| Binary Code | Gray Code |
|---|---|
| 0000 | 0000 |
| 0001 | 0001 |
| 0010 | 0011 |
| 0011 | 0010 |
| 0100 | 0110 |
| 0101 | 0111 |
| 0110 | 0101 |
| 0111 | 0100 |
| 1000 | 1100 |
| 1001 | 1100 |
| 1001 | 1101 |
| 1010 | 1111 |

However, by employing an arrangement in accordance with a presently preferred embodiment of the present invention, Gray code will maintain a code distance of 1, even when rolled over. This can be appreciated from Table 2 below, which summarizes the encode conversions for two iterations for a length of 11.

TABLE 2

Summarizes the encode conversions for two iterations for a length of 11

| BINARY NUMBER | VIRTUAL SPACE BINARY (VSB) | | Gray Code |
|---|---|---|---|
| (B) | FLAG | Bin Encode | (G) |
| 0000 | 1 | 0000 | 11000 |
| 0001 | 1 | 0001 | 11001 |
| 0010 | 1 | 0010 | 11011 |
| 0011 | 1 | 0011 | 11010 |
| 0100 | 1 | 0100 | 11110 |
| 0101 | 1 | 0101 | 11111 |
| 0110 | 1 | 0110 | 11101 |
| 0111 | 1 | 0111 | 11100 |
| 1000 | 1 | 1000 | 10100 |
| 1001 | 1 | 1001 | 10101 |
| 1010 | 1 | 1010 | 10111 |
| 0000 | 0 | 0101 | 00111 |
| 0001 | 0 | 0110 | 00101 |
| 0010 | 0 | 0111 | 00100 |
| 0011 | 0 | 1000 | 01100 |
| 0100 | 0 | 1001 | 01101 |
| 0101 | 0 | 1010 | 01111 |
| 0110 | 0 | 1011 | 01110 |
| 0111 | 0 | 1100 | 01010 |
| 1000 | 0 | 1101 | 01011 |
| 1001 | 0 | 1110 | 01001 |
| 1010 | 0 | 1111 | 01000 |

After Gray code is performed on a sequence in accordance with the virtual space discussed and broadly contemplated hereinabove, it is preferably converted back to binary. Accordingly, the Gray code may preferably be passed through a decoder circuit such as that illustrated in FIG. 3. Preferably, the Gray code is passed through a standard Gray-to-Binary converter, and a "virtual space binary" sequence is obtained. Thus, the following symbols are used in FIG. 3:

G: Gray code to be decoded
VSB: Virtual Space Binary obtained by decoding Gray code.
F: Flag bit (MSB of the decoded Gray sequence VSB).
M: Remaining bits of VSB (MSB-1:0).
S: L−C (in this case C=16, L=11; thus, S=−5)
B: Original Binary count.

Table 3, below, summarizes the decode conversions for two iterations of a length of 11 by way of a method according to at least one embodiment of the present invention. In this example, it will be noted that the original odd length sequence has been successfully retrieved from the Gray code. It will also be noted that Gray code maintains a code distance of 1, between any two consecutive numbers and also when it is rolled back (i.e., from 01000 to 11000).

TABLE 3

Summarizes the decode conversions for two iterations of a length of 11.

| Gray Code | VIRTUAL SPACE BINARY (VSB) | | BINARY NUMBER |
|---|---|---|---|
| (G) | F | M | (B) |
| 11000 | 1 | 0000 | 0000 |
| 11001 | 1 | 0001 | 0001 |
| 11011 | 1 | 0010 | 0010 |
| 11010 | 1 | 0011 | 0011 |
| 11110 | 1 | 0100 | 0100 |
| 11111 | 1 | 0101 | 0101 |
| 11101 | 1 | 0110 | 0110 |

TABLE 3-continued

Summarizes the decode conversions for two iterations of a length of 11.

| Gray Code | VIRTUAL SPACE BINARY (VSB) | | BINARY NUMBER |
|---|---|---|---|
| (G) | F | M | (B) |
| 11100 | 1 | 0111 | 0111 |
| 10100 | 1 | 1000 | 1000 |
| 10101 | 1 | 1001 | 1001 |
| 10111 | 1 | 1010 | 1010 |
| 00111 | 0 | 0101 | 0000 |
| 00101 | 0 | 0110 | 0001 |
| 00100 | 0 | 0111 | 0010 |
| 01100 | 0 | 1000 | 0011 |
| 01101 | 0 | 1001 | 0100 |
| 01111 | 0 | 1010 | 0101 |
| 01110 | 0 | 1011 | 0110 |
| 01010 | 0 | 1100 | 0111 |
| 01011 | 0 | 1101 | 1000 |
| 01001 | 0 | 1110 | 1001 |
| 01000 | 0 | 1111 | 1010 |

The techniques as described and broadly contemplated herein are particularly useful in an asynchronous FIFO of odd depth and in communications systems when an odd count has to be transferred across an asynchronous domain. The advantages are apparent when considering the area saved for having an 11-deep FIFO instead of 16-deep for data field of 64-bits is an incredible 320 bit. It will be appreciated that even more area will be saved in a large-scale FIFOs (for example, when a 35 deep FIFO is used as opposed to a 64-deep one [that would be necessitated without the embodiments of the present invention]).

In case of communication systems where there is a need to transfer an odd bit count across an asynchronous domain, the very small extra area needed to count an odd sequence would appear to be justified.

It should be appreciated that, in accordance with the embodiments of the present invention, more than one set of Gray codes could be generated for a given odd length, by choosing multiple virtual domains. This would require one more bit than the method specifically laid out hereinabove in accordance with FIGS. 2-3 and Tables 2-3, and could well and will assist in achieving fault tolerant systems that are even more robust.

It is to be understood that the present invention, in accordance with at least one presently preferred embodiment, includes elements that may be implemented on at least one general-purpose computer running suitable software programs. These may also be implemented on at least one Integrated Circuit or part of at least one Integrated Circuit. Thus, it is to be understood that the invention may be implemented in hardware, software, or a combination of both.

If not otherwise stated herein, it is to be assumed that all patents, patent applications, patent publications and other publications (including web-based publications) mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A system comprising:
   a main memory;
   a system processor; and
   a Gray code applicator comprising:
      an input which accepts a binary number sequence;
      a modifier which modifies an input binary number sequence of odd-numbered length;
      said modifier acting to retain, in a binary number sequence of odd-numbered length, a transition between each pair of successive numbers that is no greater than a one-bit transition;
   wherein said modifier acts to modify the input binary number sequence via creating a virtual number sequence.

2. The system according to claim 1, wherein said modifier acts to modify the input binary number sequence via increasing a length of the input binary number sequence by multiple integer of greater than 1.

3. The system according to claim 2, wherein said modifier acts to double the length of the input binary number sequence.

4. The system according to claim 1, wherein said modifier acts to append a flag bit to each number in the input binary number sequence.

5. The system according to claim 2, wherein the flag bit has a first value which flags a first set of numbers and a second value which flags a second set of numbers.

6. The system according to claim 5, wherein the first value of the flag bit corresponds to numbers from the input binary sequence and the second value of the flag bit corresponds to numbers in the virtual number sequence.

7. A system comprising:
   a main memory;
   a system processor; and
   a Gray code applicator comprising:
      an input which accepts a binary number sequence;
      a modifier which modifies an input binary number sequence of odd-numbered length;
      said modifier acting to retain, in a binary number sequence of odd-numbered lengths, a transition between each pair of successive numbers that is no greater than a one-bit transition,
   wherein said Gray code applicator further comprises a remodifier which acts to return the modified binary sequence to an original state.

8. A method comprising:
   accepting a binary number sequence of odd-numbered length;
   applying Gray code to the accepted binary number sequence via;
   modifying the accepted binary number sequence; and
   retaining, in the modified binary number sequence, a transition between each pair of successive numbers that is no greater than a one-bit transition; wherein said modifying comprises creating a virtual number sequence.

9. The method according to claim 8, wherein said creating of a virtual number sequence comprises increasing a length of the accepted binary number sequence by an integer multiple of greater than 1.

10. The method according to claim 9, wherein said increasing comprises doubling the length of the accepted binary number sequence.

11. The method according to claim 8, wherein said creating of a virtual number sequence comprises appending a flag bit to each number in the accepted binary number sequence.

12. The method according to claim 9, wherein the flag bit has a first value which flags a first set of numbers and a second value which flags a second set of numbers.

13. The method according to claim 12, wherein the first value of the flag bit corresponds to numbers from the accepted binary sequence and the second value of the flag bit corresponds to numbers in the virtual number sequence.

14. A method comprising:
- accepting a binary number sequence of odd-numbered length;
- applying Gray code to the accepted binary number sequence via;
- modifying the accepted binary number sequence; and
- retaining, in the modified binary number sequence, a transition between each pair of successive numbers that is no greater than a one-bit transition;
- wherein said applying of Gray code further comprises returning the modified binary sequence to an original state.

15. A program storage device readable by machine, tangibly embodying a program of instructions executable by the machine to perform a method comprising:
- accepting a binary number sequence of odd-numbered length;
- applying Gray code to the accepted binary number sequence via;
- modifying the accepted binary number sequence; and
- retaining, in the modified binary number sequence, a transition between each pair of successive numbers that is no greater than a one-bit transition; and
- wherein said modifying comprises creating a virtual number sequence.

16. A program storage device readable by machine, tangibly embodying a program of instructions executable by the machine to perform a method comprising:
- accepting a binary number sequence of odd-numbered length;
- applying Gray code to the accepted binary number sequence via;
- modifying the accepted binary number sequence; and
- retaining, in the modified binary number sequence, a transition between each pair of successive numbers that is no greater than a one-bit transition;
- wherein said applying of Gray code further comprises returning the modified binary sequence to an original state.

* * * * *